US011366178B2

(12) United States Patent
Solomon et al.

(10) Patent No.: US 11,366,178 B2
(45) Date of Patent: Jun. 21, 2022

(54) METHOD AND SYSTEM FOR DIAGNOSTICS AND MONITORING OF ELECTRIC MACHINES

(71) Applicant: GE ENERGY POWER CONVERSION TECHNOLOGY LIMITED, Warwickshire (GB)

(72) Inventors: Luke Anthony Solomon, Pittsburgh, PA (US); Stuart Gray, Houston, TX (US); Michael Richard Doucette, Pittsburgh, PA (US); Sergio Dominguez, Rugby (GB); Alexander Richard Sieman, Boardman, OH (US)

(73) Assignee: GE ENERGY POWER CONVERSION TECHNOLOGY LIMITED, Warwickshire (GB)

( * ) Notice: Subject to any disclaimer, the term of this patent is extended or adjusted under 35 U.S.C. 154(b) by 0 days.

(21) Appl. No.: 16/794,192

(22) Filed: Feb. 18, 2020

(65) Prior Publication Data
US 2020/0182945 A1 Jun. 11, 2020

Related U.S. Application Data

(62) Division of application No. 15/663,697, filed on Jul. 28, 2017, now Pat. No. 10,564,204.

(51) Int. Cl.
*G01R 31/56* (2020.01)
*G05B 23/02* (2006.01)
(Continued)

(52) U.S. Cl.
CPC ............ *G01R 31/56* (2020.01); *G01R 31/50* (2020.01); *G05B 23/0213* (2013.01);
(Continued)

(58) Field of Classification Search
None
See application file for complete search history.

(56) References Cited

U.S. PATENT DOCUMENTS 5,566,092 A 10/1996 Wang et al.
6,636,841 B1 10/2003 Austin et al.
(Continued)

OTHER PUBLICATIONS

Luo et al., "Integrated Model-Based and Data-Driven Diagnosis of Automotive Antilock Braking Systems" IEEE Transactions on Systems, Man, and Cybernetics—Part A: Systems and Humans, vol. 40, No. 2, Mar. 2010 (Year: 2010).*

(Continued)

*Primary Examiner* — John C Kuan
(74) *Attorney, Agent, or Firm* — Wood IP LLC

(57) ABSTRACT

A system for use with an electric machine is provided. The system includes a processor and a memory comprising a set of memory modules, which, when executed by the processor, cause the processor to perform certain operations. The operations include receiving operational data from the electric machine, and generating, based on the operational data, a first set of diagnostic data, by executing a first memory module from the set of memory modules. The operations further include generating, based on the operational data, a second set of diagnostic data, by executing a second memory module from the set of memory modules, the second memory module including a set of parameters associated with a diagnostics model of the electric machine. Furthermore, the operations include effecting, based on the operational data, the first set of diagnostic data, and the second set of diagnostic data, a change in at least one parameter.

5 Claims, 7 Drawing Sheets

(51) Int. Cl.
*G06F 1/28* (2006.01)
*G01R 31/50* (2020.01)
*G06N 3/02* (2006.01)
*G06N 20/20* (2019.01)
*G06N 20/00* (2019.01)
*G06N 20/10* (2019.01)

(52) U.S. Cl.
CPC ..... *G05B 23/0243* (2013.01); *G05B 23/0297* (2013.01); *G06F 1/28* (2013.01); *G05B 23/024* (2013.01); *G05B 23/0254* (2013.01); *G06N 3/02* (2013.01); *G06N 20/00* (2019.01); *G06N 20/10* (2019.01); *G06N 20/20* (2019.01)

(56) References Cited

U.S. PATENT DOCUMENTS

| | | |
|---|---|---|
| 6,646,397 B1 | 11/2003 | Discenzo |
| 8,583,597 B2 | 11/2013 | Atamna et al. |
| 8,710,976 B2 | 4/2014 | Zheng et al. |
| 8,868,985 B2 | 10/2014 | Hackstein et al. |
| 9,245,116 B2 | 1/2016 | Evans et al. |
| 9,366,451 B2 | 6/2016 | Guo et al. |
| 10,261,851 B2 | 4/2019 | Velipasaoglu et al. |
| 10,487,640 B2 | 11/2019 | Aniket et al. |
| 10,564,204 B2 | 2/2020 | Solomon et al. |
| 2018/0293125 A1 | 10/2018 | Lulu et al. |

OTHER PUBLICATIONS

Tidriri et al., "Bridging data-driven and model-based approaches for process fault diagnosis and health monitoring: A review of researches and future challenges" Annual Reviews in Control 42 (2016) 63-81 (Year: 2016).*

Extended European Search Report issued in connection with corresponding EP Application No. 18184768.2 dated Dec. 20, 2018.

Kozlowski et al., "Electrochemical Cell Diagnostics Using Online Impedance Measurement, State Estimation and Data Fusion Techniques" 6 Proceedings of IECEC'01 36th Intersociety Energy Conversion Engineering Conference Jul. 29-Aug. 2, 2001 (Year: 2001).

Hu et al., "A co-training-based approach for prediction of remaining useful life utilizing both failure and suspension data" Mechanical Systems and Signal Processing 62-63 (2015) 75-90 (Year: 2015).

* cited by examiner

METHOD AND SYSTEM FOR DIAGNOSTICS AND MONITORING OF ELECTRIC MACHINES

TECHNICAL FIELD

The present disclosure relates to electric machines. More particularly, the present disclosure relates to a method and a system for diagnostics and monitoring of an electric machine.

BACKGROUND

Many traditional diagnostics and monitoring platforms for electric machines use a two-step process to identify fault conditions. For example, typical diagnostics and monitoring platforms first use physics model-based or other non-learning routines to flag data believed to show a fault condition. And, in a subsequent step, an expert technician performs a more thorough analysis using any combination of additional analytical tools and expert experience to evaluate the data to determine whether the data shows either a properly diagnosed fault condition or a false positive condition, before enunciating the fault condition.

These additional analytical steps add to the time between when a fault occurs and when the fault condition is enunciated to the customer. As such, typical diagnostics and monitoring platforms add complexity to diagnostics and monitoring operations, and they require expert-level technician input in order to properly analyze fault data, both conditions that may cause unwanted down time and loss of revenue.

SUMMARY

The embodiments featured herein help solve or mitigate several the aforementioned issues. For example, the embodiments feature the use of adaptive routines along with non-adaptive routines. The adaptive routines may include a neural network, a machine learning-based routine, or generally, a process that can have its operational parameters modified or tuned using operational data. The non-adaptive routines may be physics-based, finite element analysis (FEA)-based, or based on other non-learning or other non-adaptive routines. In some embodiments, an expert technician's assessments of the incoming data are aggregated so that, through supervised learning, the adaptive diagnostics and monitoring routine can be trained to identify false positives in the place of the expert technician Thus, the embodiments reduce system complexity, and they allow a more rapid enunciation of a fault condition in one or more electric machines. Consequently, the embodiments help reduce or eliminate the demand on expert technician input to analyze the fault data. In addition, the use of non-adaptive methods with the adaptive methods helps mitigate or eliminate "learning" time across an entire system.

While a typical adaptive routine would require an extensive "learning" period in which the normal operation of the system is characterized and no fault identification or enumeration would be performed, in some of the embodiments, the use of a non-adaptive method for fault identification in parallel with an adaptive method allows for fault identification and enumeration even during the "learning" period of the system. Further, since typical adaptive routines assume that the system is "healthy" during the learning period, the characterization of the system built by the adaptive routine may be incorrect, a non-adaptive routine, which is typically built from an ideal model of the system would be able to detect faults even on a recently installed system.

One exemplary embodiment having the above-mentioned features and advantages is a system that includes a processor and a memory comprising a set of memory modules, which, when executed by the processor, cause the processor to perform certain operations. The operations include receiving operational data from an electric machine, and generating, based on the operational data, a first set of diagnostic data, by executing a first memory module from the set of memory modules. The operations further include generating, based on the operational data, a second set of diagnostic data, by executing a second memory module from the set of memory modules, the second memory module including a set of parameters associated with a diagnostics model of the electric machine. Furthermore, the operations include effecting, based on the operational data, the first set of diagnostic data, and the second set of diagnostic data, a change in at least one parameter.

Another embodiment provides a system for use with a set of electric machines. The system includes a processor and n memory that includes a set of memory modules, which, when executed by the processor, cause the processor to perform certain operations. The operations can include receiving operational data from at least two electric machines from the set of electric machines, and generating, based on the operational data from each of the at least two electric machines, first sets of diagnostic data, by executing a first memory module from the set of memory modules.

The operations can further include generating, based on the operational data from each of the at least two electric machines, second sets of diagnostic data, by executing a second memory module from the set of memory modules, the second memory module including a set of parameters associated with a diagnostics model for the set of electric machines. Furthermore, the operations may include effecting, based on the first sets of diagnostic data, the second sets of diagnostic data, and the operational data from one of the at least two electric machines, a change in at least one parameter associated with the one of the at least two electric machines.

Another embodiment provides a method for use with an electric machine. The method includes receiving, by a diagnostic unit, operational data from the electric machine. The method further includes generating, by the diagnostic unit and based on the operational data, a first set of diagnostic data. The method further includes generating, by the diagnostic unit and based on the operational data, a second set of diagnostic data. The method further includes effecting, based on the operational data, the first set of diagnostic data, and the second set of diagnostic data, a change in at least one parameter of a diagnostic model of the diagnostic unit used to generate the second set of diagnostic data.

Additional features, modes of operations, advantages, and other aspects of various embodiments are described below with reference to the accompanying drawings. It is noted that the present disclosure is not limited to the specific embodiments described herein. These embodiments are presented for illustrative purposes. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments ere shown in the accompanying drawings, throughout which like reference numerals may indicate corresponding or similar parts in the various drawings. The drawings are for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

Figure 1:
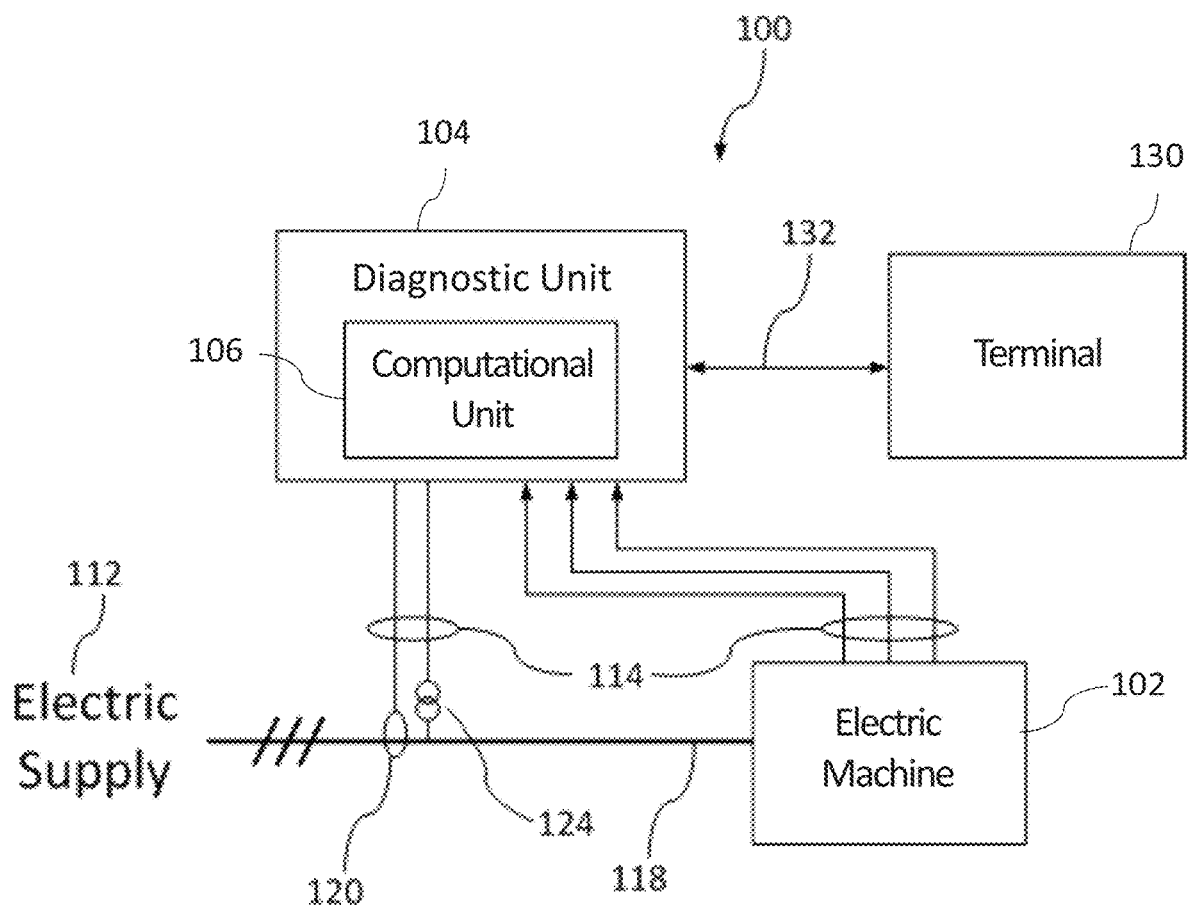
FIG. 1 illustrates a system in accordance with several aspects described herein.

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Some embodiments include a remote diagnostics and monitoring system and associated method of operation of the system In the exemplary system, a processor executes a physics-based, finite element analysis (FEA)-based, or other non-learning or generally, other non-adaptive routine, to produce a first set of outputs. The first set of outputs is combined with a second set of outputs obtained from an adaptive routine, also executed by the processor. The adaptive routine may feature a neural network, a machine learning-based routine, or generally, a process that can have its operational parameters modified or tuned using operational data A routine may be construed herein as a program configured in whole or in part to cause a processor to perform certain operations.

Both the adaptive and the non-adaptive routines produce the same health status indicator of an electric machine (e.g., both the non-adaptive and the adaptive routines can determine if a broken rotor bar is present in the electric machine). In the embodiments, combining the first set of outputs, the second set of outputs, and data obtained based on the assessment of the expert technician enables supervised learning in the system, which reduces or eliminates required expert technician intervention in addition to reducing the number of false positives and or false negatives in the system.

The system includes an electric machine and a diagnostic unit that includes a computational unit (comprising a processor and memory) configured to receive operational data (at least one of voltage, current, vibration signature, temperature, and insulation integrity) of one or more electric machines and perform, on the operational data, at least one diagnostic test. The at least one diagnostic test can be executed by either one or both of a non-adaptive routine and an adaptive routine stored in the memory of a processor.

The embodiments further include a supervisory routine also stored in the memory and which coordinates the outputs of the non-adaptive and the adaptive routines. In one embodiment, an exemplary system has a "learning" phase in which the supervisory routine sends the results of both the non-adaptive routine and the adaptive routine to an expert machine technician who can then classify whether the output constitutes a true fault or a false positive. Further, the expert can update or tune the weights of the adaptive routine using this new data input classification In another embodiment, a "trained" phase of the system requires no technician intervention, and the supervisory routine determines if there is a fault in the system using any combination of the non-adaptive and adaptive routines.

In another embodiment, the system has a "semi-trained" phase in which no technician intervention is required if the supervisory routine determines that the outputs of the non-adaptive and adaptive routines both show identical results (within a margin of error) but in which the supervisory routine will send the results of both the non-adaptive routine and the adaptive routine to the expert machine technician for further assessment if the routines' results deviate from each other (e.g., beyond a predetermined acceptable margin of error). Several embodiments consistent with the aforementioned features and advantages are described below in regards to FIGS. 1-5.

FIG. 1 illustrates a system 100 according to an embodiment. The system 100 includes an electric machine 102 that is powered by an electric supply 112. The electric supply 112 may drive the electric machine 102 by providing it current and voltage, in addition to other control commands, via a plurality of wires that form a power bus 118. The currents and voltages are respectively measured by a current sensor 124 and a voltage sensor 120. The electric supply 112 may be comprised of a power converter, including, without limitation, a variable frequency drive (VFD), which may, through a plurality of control routines or regimen stored in a memory of the power converter controller, determine the voltage and current supplied to power bus 118.

The system 100 further includes a diagnostics unit 104 that is coupled with the electric machine 102 and that may serve to obtain status data or status information from the electric machine 102. For example, the diagnostics unit 104 can be configured to retrieve or to instruct the electric machine 102 to send a set of sensor measurements 114, which may include, for example, and not by limitation, temperature, voltage, current, vibration, and insulation integrity data pertaining to the electric machine 102. The sensor measurements 114 may be construed as operational data that pertain to a state of the electric machine 102.

The diagnostics unit 104 includes a computational unit 106 that can include a computational unit, which can be a processor configured to execute at least one monitoring and diagnostics routine, as shall be described in further details below. As such, the diagnostics unit 104 may perform one or more diagnostics tests based on the operational data. For example, and not by limitation, the diagnostics unit 104 may infer a state of the electric machine 102 based on at least one of the voltage, current, vibration signature, temperature, and insulation integrity, which may be provided to the diagnostics unit 104 as part of the sensor measurements 114.

The computational unit 104 may output data to a terminal 130 accessible to one or more expert technicians via an interface link 132. As shall be described in further details below, the terminal 130 may also communicate with the computational unit 104 to provide it updates for one or more adaptive routines.

It should be understood that while the block diagram 100 features the interconnection between the diagnostics unit 104 with the terminal 130 and the electric machine 102, various implementations may be achieved without departing from the scope of the disclosure. For example, the diagnostics unit 104 may be a module that is part of the electric machine 102, or in alternate implementations, part of the terminal 130.

Figure 2:
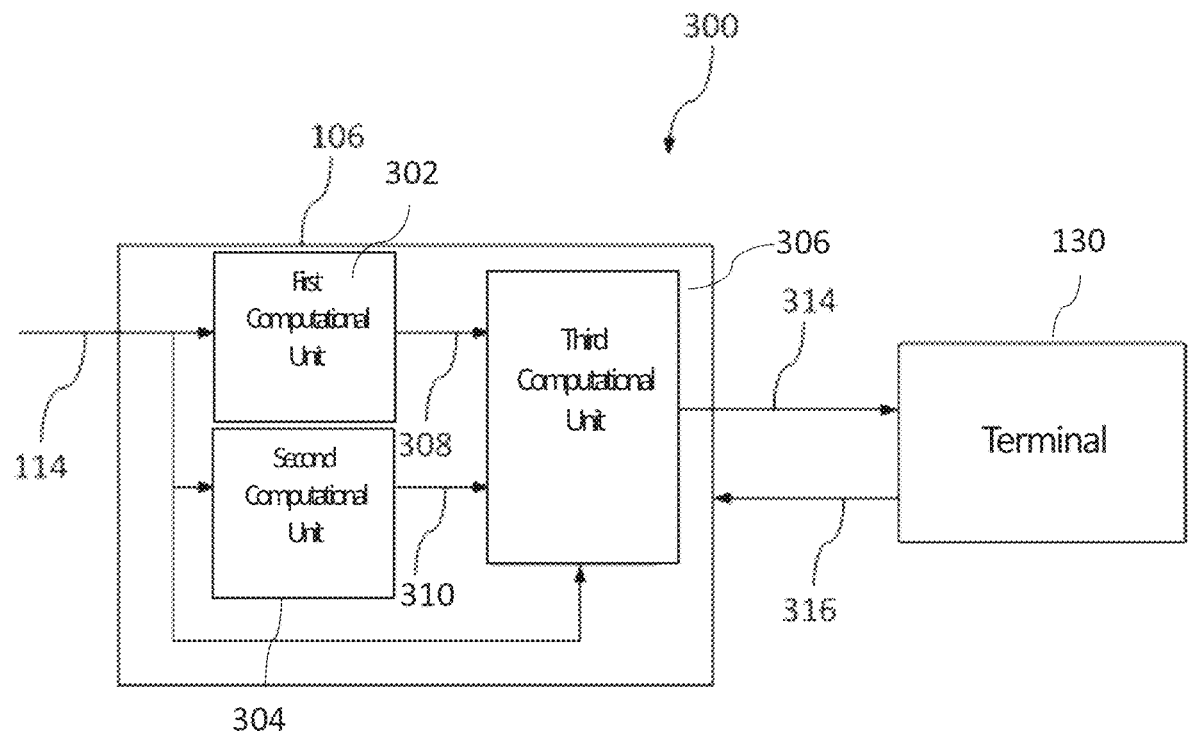
FIG. 2 illustrates a computational unit in accordance with several aspects described herein.

FIG. 2 depicts a block diagram 300 of the computational unit 106 contained within the diagnostics unit 104. Generally, the computational unit 106 may be a core, processor, or an embedded application-specific computer that is programmed by instructions, i.e., routines, stored in a memory. The instructions configure the processor to perform several operations that cause the diagnostics unit to perform as featured throughout the present disclosure.

The computational unit 106 includes a first computational module 302, a second computational module 304, and a third computational module 306. The computational unit 106 receives operational data, e.g., the sensor measurements 114, and the operational data is processed through the execution of instructions stored in the first computational module 302 and in the second computational module 304. The first computational module 302 may contain a non-adaptive diagnostics routine whereas the second computational module 304 may contain an adaptive diagnostics routine. The execution of these routines results in non-adaptive routine diagnostic output 308 and adaptive routine diagnostic output 310, respectively.

As configured, the diagnostics unit 134 performs a diagnostic analysis on adaptive routine diagnostic output 310 the asset (the electric machine 102), using both the non-adaptive routine and the adaptive routine (e.g., neural network, machine learning-based routine, or other routine which can have its operational parameters modified by operational data).

The third computational module 306, which includes a supervisory routine or module that determines whether the operational data and the routine outputs (308 and 310) should be sent to the terminal 130 for further analysis.

In one example, an expert technician, using any combination of expert experience or additional computational techniques, may perform an analysis of the received data 314, which may consist of at least one of the non-adaptive routine diagnostic output 308, the adaptive routine diagnostic output 310, and the operational data, to evaluate whether the received data 314 shows a fault condition or does not show a fault condition. The received data 314 may then be added to a database, along with a classification of the data from the expert technician. If the expert technician determined a fault condition was present, a fault condition may be enunciated, i.e., the electric machine 102 may be marked for repair.

The expert technician can then choose to retrain (calculate new parameters/inputs for) the adaptive routine in the second memory module 304 in order to tune the performance of the adaptive routine and activate these changes to the adaptive routine by transmitting a set of commands and the necessary changes to the computational unit 106 via the interface 316 between the terminal and the computational unit.

In contrast, if the expert technician determines, through any combination of expert experience and computational techniques, that the adaptive routine has been tuned to a performance deemed acceptable, the technician can choose to modify the supervisory routine of the third computational module 306. This modification determines whether the operational data and the routine outputs (308 and 310) should be sent to the expert technician for additional analysis, via the interface 316 between the terminal and the computational unit 106. Further, the technician can choose to allow any combination of routine outputs to directly enunciate the fault condition without requiring prior expert technician assessment to confirm the fault condition In the latter case, no expert technician intervention is needed for subsequent detections of faults.

As such, the embodiments provide a system that reduces expert technician intervention and that reduces false positives and false negatives in a diagnostics and monitoring platform A supervisory routine (e.g., in the computational module 306), using the outputs of the non-adaptive and adaptive routines (308 and 310, respectively) as well as the operational data input from sensor measurements 114, is used to determine whether expert technician intervention is required (e.g., to confirm a fault condition identified by the adaptive and the non-adaptive routines).

The expert technician may use collected data, as well as the outputs of the non-adaptive and adaptive routines to then tune the adaptive routine's performance. If the adaptive routine performance is deemed by the expert technician to be acceptable, then the expert technician can change a rules-based system used to determine whether technician intervention is required to reduce or eliminate notifications to the expert technician based on the performance of the routines. Further description of an example use of the system 100 will be described in regards to FIG. 5.

Figure 3:
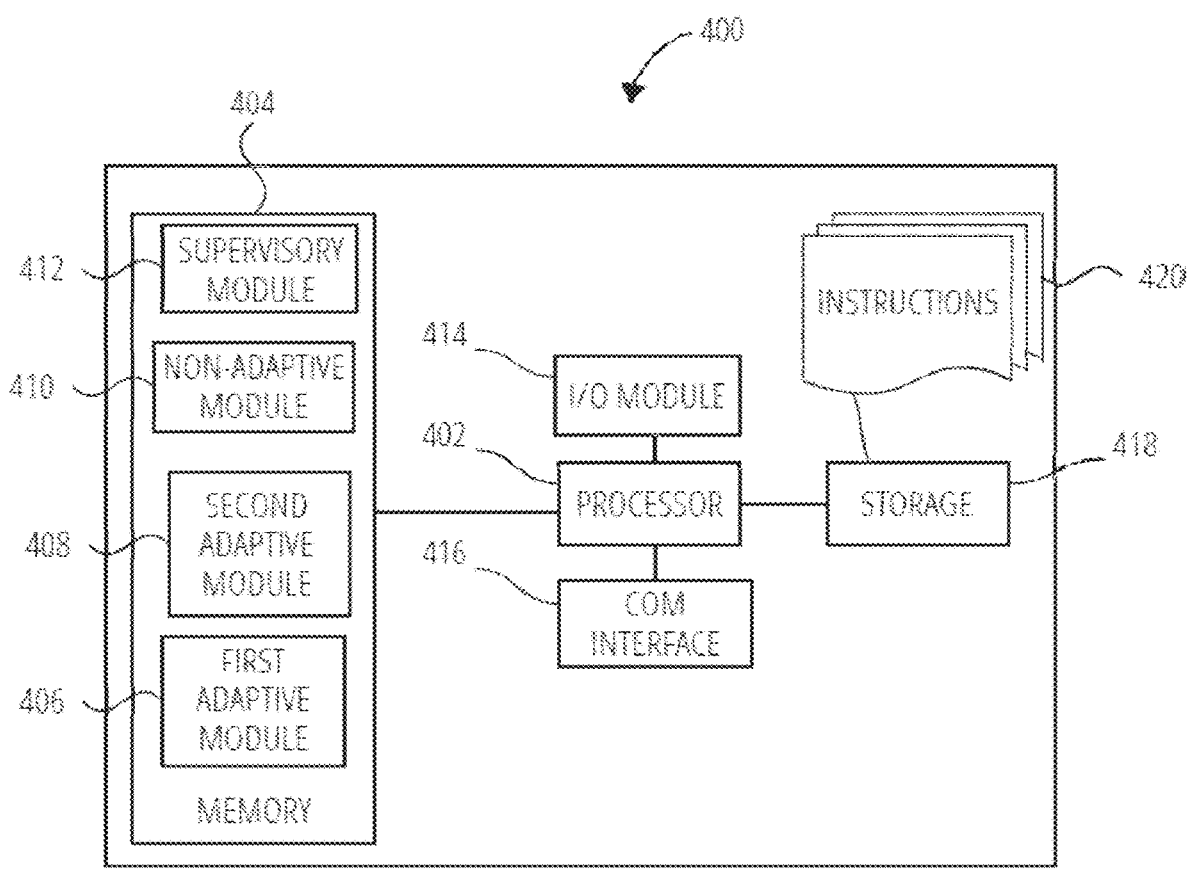
FIG. 3 illustrates a block diagram of a controller in accordance with several aspects described herein.

FIG. 3 shows a block diagram of a controller 400, representing a software/firmware and hardware implementation of diagnostics unit 104. The controller 400 includes a processor 402 that has a specific structure. The specific structure is imparted to the processor 402 by instructions stored in a memory 404 and/or by instructions 420 that may be fetched by the processor 402 from a storage medium 418. The storage medium 418 may be co-located with the controller 400 as shown, or it may be located elsewhere and be coupled to the controller 400. Further, the controller 400 can be a stand-alone programmable system, or it can be a programmable module located in a much larger system. For example, the controller 400 may be integrated with the electric machine 102 or with the terminal 130.

The controller 400 may include one or more hardware and/or software components configured to fetch, decode, execute, store, analyze, distribute, evaluate, and/or categorize information. Furthermore, controller 400 can include an input/output (I/O) 414 that is configured to interface with an electric machine 102, or with a plurality of electric machines like the electric machine 102.

The processor 402 may include one or more processing devices or cores (not shown) In some embodiments, the processor 402 may be a plurality of processors, each having either one or more cores. The processor 402 can be configured to execute instructions fetched from the memory 404, i.e., from one of the memory block 412, the memory block 410, the memory block 408, or the memory block 406, or the instructions may be fetched from the storage medium 418, or from a remote device connected to the controller 400 via a communication interface 416.

Furthermore, without loss of generality, the storage medium 418 and/or die memory 404 may include a volatile or non-volatile, magnetic, semiconductor, tape, optical, removable, non-removable, read-only, random-access, or any type of non-transitory computer-readable computer medium. The storage medium 418 and/or the memory 404 may include programs and/or other information that may be used by the processor 402. Furthermore, the storage medium 418 may be configured to log data processed, recorded, or collected during the operation of controller 400. The data may be time-stamped, location-stamped, cataloged, indexed, or organized in a variety of ways consistent with data storage practice.

The memory block 406 may include a first adaptive routine, the memory block 408 may include a second adaptive routine, the memory block 410 may include a non-adaptive routine, and the memory block 412 may include a supervisory routine. In one embodiment, the processor 402 may be configured by instructions in the memory 404 to perform certain operations.

The operations can include receiving operational data from the electric machine 102. The operations further include generating a first set of diagnostic data by the processor 402 executing the non-adaptive module of the memory block 410. The operations further include generating a second set of diagnostic data by the processor 402 executing die adaptive module of either one of the memory blocks 406 or 408. The adaptive module may include an adaptive routine that includes a set of parameters associated with a diagnostics model of the electric machine. The operations may further include effecting, based on the operational data, the first set of diagnostic data, and the second set of diagnostic data, a change in at least one parameter in the adaptive routine.

In another embodiment, the controller 400 may serve as hub that receives operational data from a plurality of electric machines. In this case, the processor 402 can perform operations that include receiving operational data from at least two electric machines from a set of electric machines. The operations can include generating, based on the operational data from each of the at least two electric machines, first sets of diagnostic data, by executing a first memory module from that includes a non-adaptive routine (e.g., the memory module 410).

The operations may further include generating, based on the operational data from each of the at least two electric machines, second sets of diagnostic data, by executing an adaptive routine (e.g., the memory module 406). The adaptive routine can include a set of parameters associated with a diagnostics model for the set of electric machines. Moreover, the operations can include effecting, based on the first sets of diagnostic data, the second sets of diagnostic data, and the operational data from one of the at least two electric machines, a change in at least one parameter of the adaptive routine.

Figure 4A:
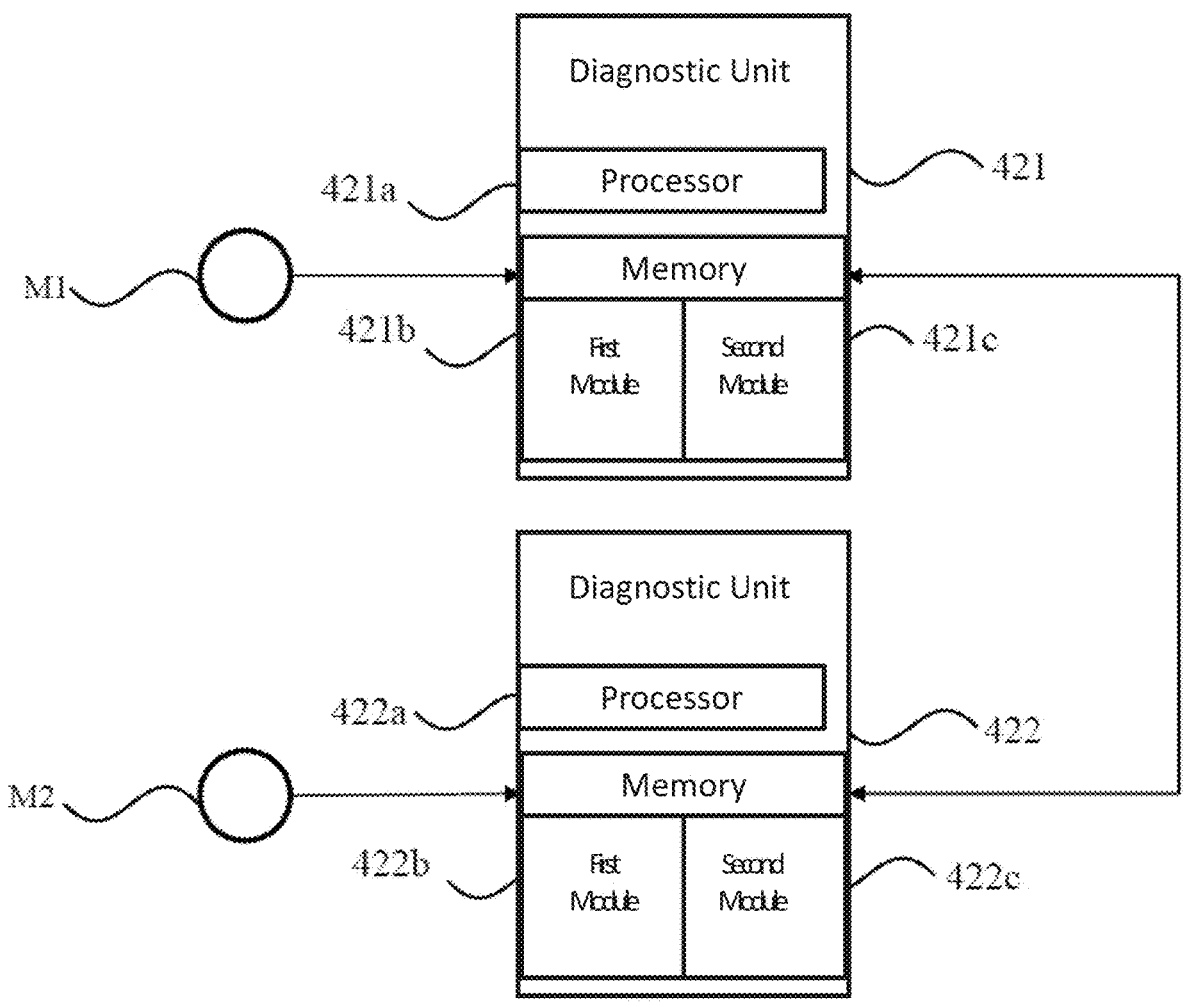
FIG. 4A illustrates a system in accordance with several aspects described herein.

FIG. 4A illustrates a system 430 in accordance with an embodiment. The system 430 includes two electric machines denoted M1 and M2. Each electric machine is associated with a specific diagnostic unit. For example, the electric machine M1 is associated with a diagnostic unit 421, and the electric machine M2 is associated with a diagnostic unit 422. Each diagnostic unit may be incorporated within its corresponding electric machine. Generally, each diagnostic unit may be co-located with its corresponding electric machine. Further, while only two electric machines are shown, the system 430 may include more than two electric machines, and each electric machine may have its own diagnostic unit.

The diagnostic unit 421 may be a controller similar to the controller 400 described above. Specifically, the diagnostic unit 421 may include a processor 421a and a memory that includes a first module 421b and a second module 421c. The first module 421b may include instructions consistent with a non-adaptive routine that cause the processor 421a to generate a first set of diagnostic data based on operational data received by the diagnostic unit 421. The second module 421c may include instructions that cause the processor 421a to generate a second set of diagnostic data based on the received operational data. Furthermore, the second module 421c may include a set of parameters that configure the processor 421a as part of an adaptive routine that generates the second set of diagnostic data.

The diagnostic unit 422, which is associated with the electric machine M2, may be configured to function with respect to the electric machine M2 in a manner similar to the diagnostic unit 421. Specifically, the processor 422a may be configured to generate, based on received operational data from the electric machine M2, a first set of diagnostic data based on a non-adaptive routine of the first module 422b and a second set of diagnostic data based on an adaptive routine stored in the second module 422c. Furthermore, the second module 422c may include a set of parameters that define the adaptive routine stored in the second module 422c.

In one use case, the diagnostic unit 421 may communicate the first set of diagnostic data, the operational data, and the second set of diagnostic data of the electric machine M1 to the diagnostic unit 422. The processor 422a may effect a change in the set of parameters included in the second module 422c based on the data received from the diagnostic unit 421. In other words, in the system 430, diagnostic data from one electric machine may be used to effect a change in the set of parameters of an adaptive routine associated with another electric machine. Generally, diagnostic data from one electric machine may be used to effect a change in the adaptive control routines of more than one other electric machine in the system.

Figure 4B:
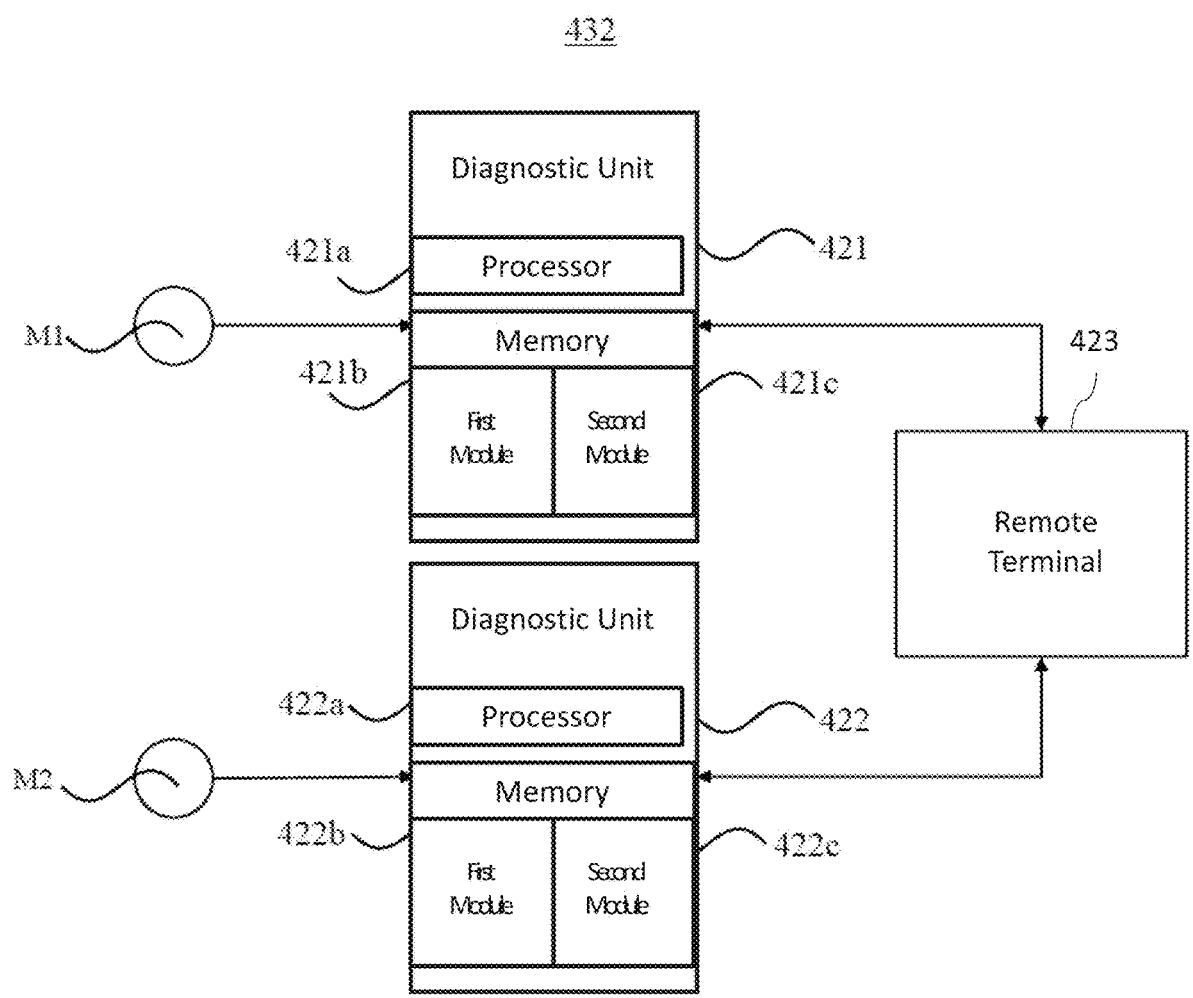
FIG. 4B illustrates a system in accordance with several aspects described herein.

FIG. 4B illustrates a system 432 in accordance with another embodiment. The system 432 is configured similarly to the system 430, with the exception that a remote terminal 423 may receive the data from each of the diagnostic units 421 and 422. The remote terminal 423 may be accessible by an expert operator who may then effect a change in a set of parameters in a particular diagnostics unit (e.g., the set of parameters included in the second module 422c of the diagnostics unit 422) from data received from the diagnostics unit 421.

Figure 5:
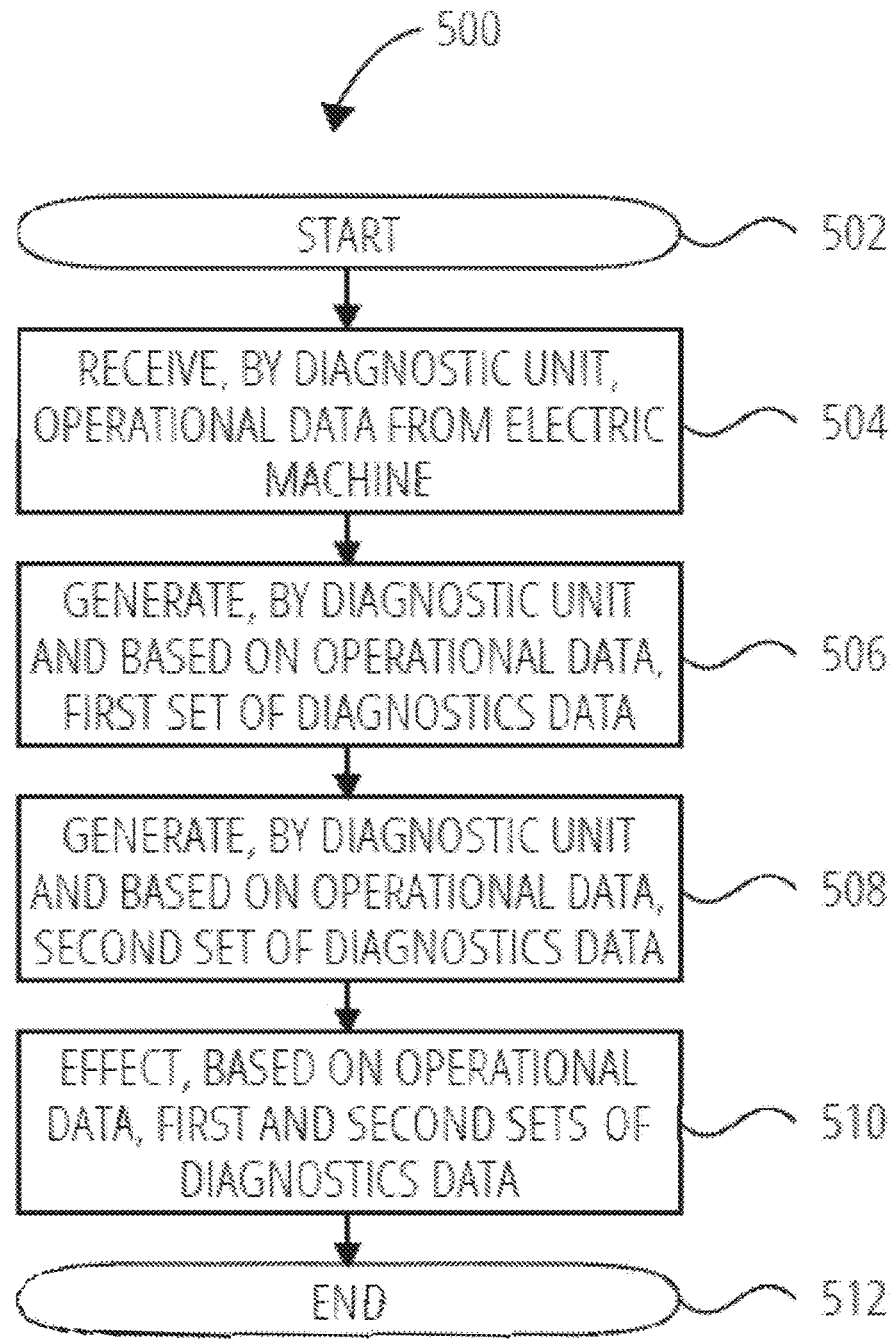
FIG. 5 depicts a flow chart of a routine in accordance with several aspects described herein.
Figure 6:
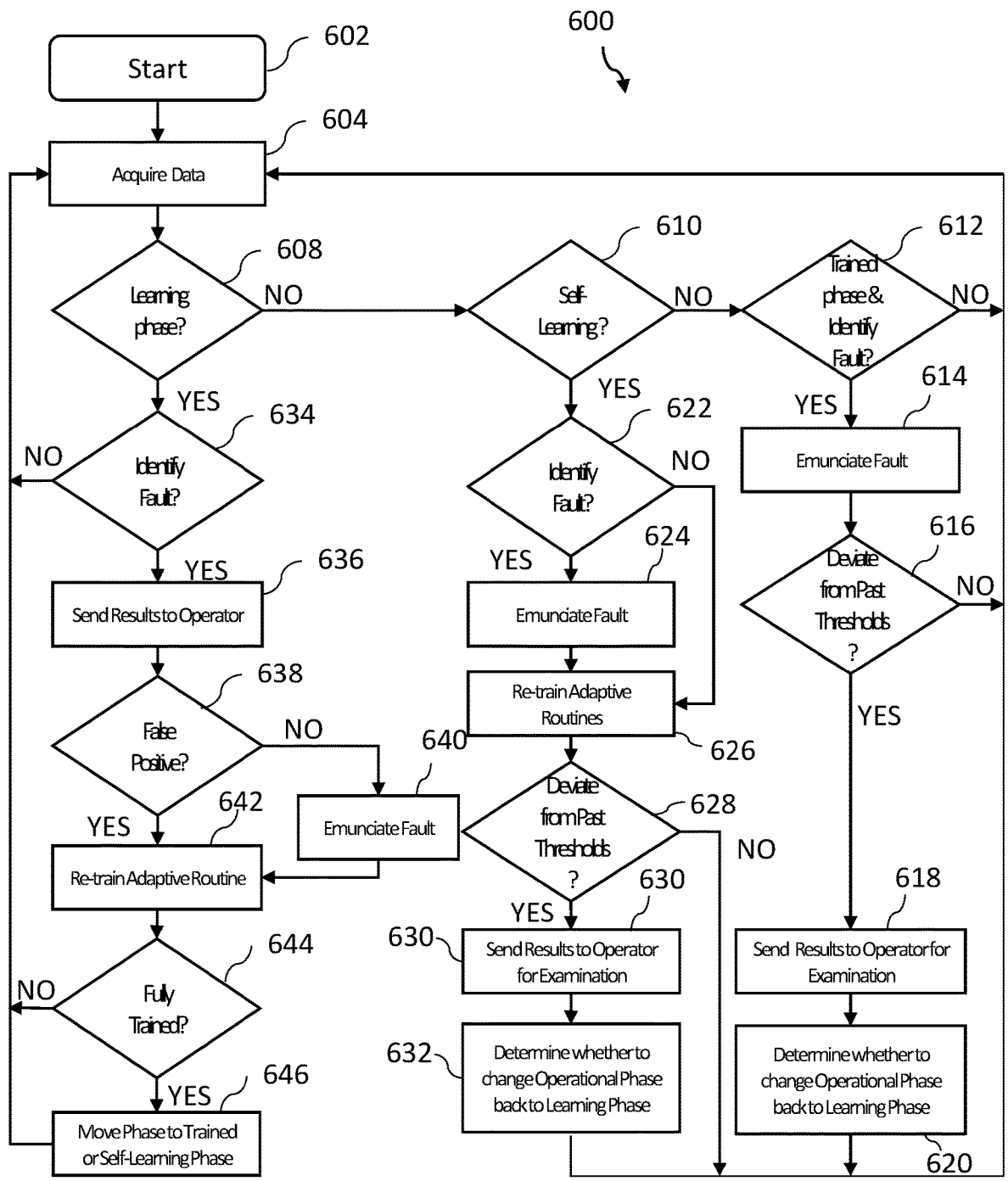
FIG. 6 depicts a flow chart of a routine in accordance with several aspects of the subject matter in accordance with one embodiment.

Having set forth several embodiments, methods 500 and 600, which are consistent with their operation, is now described with respect to FIG. 5 and FIG. 6, respectively. FIG. 5 illustrates the method 500, which can be executed by the diagnostics unit 104. The method 500 begins at step 502, and it includes receiving (at step 504) operational data from an electric machine. The method 500 includes generating (at step 506), based on the operational data, a first set of diagnostic data.

The method 500 further includes generating (at step 508), based on the operational data, a second set of diagnostic data. The first set of diagnostic data may be generated according to a non-adaptive routine and the second set of diagnostic data may be generated according to an adaptive routine. The method 500 further includes effecting (at step 510), based on the operational data, the first set of diagnostic data, and the second set of diagnostic data, a change in at least one parameter of a diagnostic model. The diagnostic model is associated with the adaptive routine used to generate the second set of diagnostic data. The process ends at step 512.

FIG. 6 depicts a flow chart of the method 600, which is yet another exemplary operation of the systems described herein. The method 600 may begin at step 602, and it includes acquiring/receiving operational data by a diagnostics unit (step 604). And then the operational data may then be analyzed using both non-adaptive and adaptive routines. A determination may be made at decision block 608, by the diagnostic unit, whether the system is placed in a learning phase, a setting that may depend on previously received commands by the diagnostics unit. If the determination is negative, the method 600 moves to the decision block 610, wherein the diagnostics unit is in a self-learning phase, which is again, a state that may be determined by the diagnostics unit based on previously received information.

If the determination at the decision block 610 is negative, the method 600 moves to the decision block 612, at which point the method 600 places the diagnostics unit in a "trained" phase. At decision block 612, a remote terminal (e.g., the terminal 204) determines whether a combination of machine-learning routines (i.e., adaptive routines) and non-adaptive routines identify a fault. If no, the method 600 returns to the step 604. If a fault is detected, then the fault is enunciated (step 614), before the method 600 moves to decision block 616.

At block 616, it is determined, e.g., by the supervisory routine associated with the computational module 306, whether results from the adaptive and non-adaptive routines deviate from past thresholds. If the results do not deviate, the method 600 returns to the step 604. Otherwise, the method continues to step 618, where the results are provided to an expert operator for examination.

Upon examination, the operator determines whether to change the operational phase of the system back to a learning phase (step 620), and she further decides to either remain in the trained phase, to return to the learning phase, or to enter into the self-training phase. The method then moves back to the step 604.

At step 610, if the determination is made at the decision block 610 that the system is in a self-learning phase, the method 600 moves to the decision block 622, wherein it is determined (e.g., by the supervisory routine associated with the computational module 306), whether a combination of machine-learning routines (i.e., adaptive routines) and non-adaptive routines identifies a fault. If a fault is identified, then it is enunciated (step 624) and the method 600 moves to step 626 where the adaptive routines are retrained using any combinations of new data, the results of the non-adaptive routine, and that of the adaptive routine. Similarly, if a fault is not detected at the decision block 622, the method 600 moves to the step 626.

After retraining, the method 600 moves to the decision block 628, wherein it is determined, e.g., by the supervisory routine associated with the computational module 306, whether results from the adaptive and non-adaptive routines deviate from past thresholds. If the determination is negative, the method 600 moves back to the step 604. Otherwise, the method continues to step 630, where the results are provided to an expert operator for examination Upon examination, the operator determines whether to change the operational phase of the system back to a learning phase (step 632), and she further decides to either remain in the self-learning phase, to return to the learning phase, or to enter into the trained phase. The method then moves back to the step 604.

At the decision block 608, when the determination is positive, i.e., when the system is in a learning phase, the method 600 moves to the decision block 634, where it is determined whether a non-adaptive routine has identified a fault condition. If not, the method 600 returns to the step 604. Otherwise, the method 600 continues to the step 636, where the results of the non-adaptive routine, as well as the results of the adaptive routines, are sent to the expert operator along with the operational data acquired at step 604.

The method 600 then moves to the decision block 638 to determine whether a false positive was identified by the non-adaptive routine. If yes, and no fault occurred, and the method moves to the step 642. If no, and the fault was correctly identified, then the fault is enunciated (step 640), and the method 600 also moves to the step 642, at which point the adaptive routine is retrained using any combination of new data, existing data, results from the non-adaptive routine, results from the adaptive routine, and operator fault classification information (the determination of whether a fault was a false positive or a true positive).

From the step 642, the method 600 then moves to the decision block 644, where an expert operator determines whether the adaptive routine is fully trained. If such a determination is negative, the method 600 returns to the step 604. Otherwise, the method 600 moves to the step 646 where the expert can move the system phase to "trained" or "self-learning." The method 600 then returns to the step 604. The method 600 can then continually run; as can readily be understood by one of skill in the art and from the flow chart of the method 600, the more the adaptive routine is trained, the less expert operator intervention is required when in the self-learning or trained phases. Specifically, when properly trained, the system may move from the step 604 to the decision block 616 and return back to the step 604, thus eliminating the operator intervention.

Generally, the embodiments leverage an adaptive routine to reduce the number of false positives in a system. As such, the embodiments allow more accurate results than a generalized non-adaptive routine would provide. Further, with the embodiments, the need for expert technician intervention is greatly reduced. When a fleet of similar assets are monitored, the data from all of these assets can be used to further refine the adaptive routine's performance.

The embodiments allow several technical and commercial advantages. For example, the embodiments help reduce the need for expert technician intervention, which increases response time if an asset fault is diagnosed. Further, the embodiments allow a reduction in false positives, which correlates with costs savings since fewer personnel need to be involved in classifying diagnostics and monitoring data.

Several embodiments consistent with the teachings presented herein are described below. These embodiments are examples and should not be construed as limiting the disclosure. Further, one of skill in the art will readily recognize that several modifications and adaptations of the embodiments described below can be achieved without departing from the scope of the present disclosure.

One embodiment provides a system for use with an electric machine. The system includes a processor and a memory comprising a set of memory modules, which, when executed by the processor, cause the processor to perform certain operations. The operations include receiving operational data from the electric machine, and generating, based on the operational data, a first set of diagnostic data, by executing a first memory module from the set of memory modules. The operations further include generating, based on the operational data, a second set of diagnostic data, by executing a second memory module from the set of memory modules, the second memory module including a set of parameters associated with a diagnostics model of the electric machine. Furthermore, the operations include effecting, based on the operational data, the first set of diagnostic data, and the second set of diagnostic data, a change in at least one parameter.

The operational data may include sensor data received by the processor from one or more sensors associated with the electric machine. In one scenario, a technician may, based on die operational data, the first data set, and the second data set, generate user data and communicate such user data to the processor. The user data may include a set of commands that instruct the processor to alter one or more diagnostics parameters represented in the second memory module. As such, the second memory module may function as a set of adaptive routines that can be updated based on a previous execution (by the processor) of the first memory module, the second memory module, and user supplied data.

In other words, the second memory module is configured to perform an adaptive process on the operational data. In contrast, the first memory module is configured to perform a non-adaptive process on the operational data. In the case of the first memory module, the non-adaptive process may be a physics-based model of the electric machine or a finite-element-analysis (FEA)-based model of the electric machine. Generally, the first memory module is based a non-learning-based routine whereas the second memory module pertains to a learning-based routine.

One embodiment provides a system for use with a set of electric machines. The system includes a processor and a memory that includes a set of memory modules, which, when executed by the processor, cause the processor to perform certain operations. The operations can include receiving operational data from at least two electric machines from the set of electric machines, and generating, based on the operational data from each of the at least two electric machines, first sets of diagnostic data, by executing a first memory module from the set of memory modules.

The operations can further include generating, based on the operational data from each of the at least two electric machines, second sets of diagnostic data, by executing a second memory module from the set of memory modules, the second memory module including a set of parameters associated with a diagnostics model for the set of electric machines. Furthermore, the operations may include effecting, based on the first sets of diagnostic data, the second sets of diagnostic data, and the operational data from one of the at least two electric machines, a change in at least one parameter associated with the one of the at least two electric machines.

Another embodiment provides a method for use with an electric machine. The method includes receiving, by a diagnostic unit, operational data from the electric machine. The method further includes generating, by the diagnostic unit and based on the operational data, a first set of diagnostic data. The method further includes generating, by the diagnostic unit and based on the operational data, a second set of diagnostic data. The method further includes effecting, based on the operational data, the first set of diagnostic data, and the second set of diagnostic data, a change in at least one parameter of a diagnostic model of the diagnostic unit used to generate the second set of diagnostic data.

Furthermore, yet another embodiment may be a system that does not include or use a non-adaptive routine. In other words, the first and second memory modules mentioned above may each cause the processor to execute two adaptive routines. Each of the adaptive routines can then be trained until they reach such a point that user intervention is not required or is infrequently required. Sated otherwise, in for this alternate embodiment, the non-adaptive routine described in the method 600 may be replaced by another adaptive routine, and training may require altering both adaptive routines.

Another embodiment may be a system for use with a first electric machine and a second electric machine. The system includes a processor and a memory including a set of memory modules, which when executed by the processor, cause the processor to perform certain operations. The operations can include receiving operational data from a diagnostics unit of the first electric machine and generating, based on the operational data, a first set of diagnostic data, by executing a first memory module from the set of memory modules.

The operations can further include generating, based on the operational data, a second set of diagnostic data, be executing a second memory module from the set of memory modules, the second memory module including a set of parameters associated with a diagnostics model for the first electric machine. Furthermore, the operations can include effecting, based on the first set of diagnostic data, the second set of diagnostic data, and the operational data, a change in at least one parameter associated with the second electric machine.

Those skilled in the relevant art(s) will appreciate that various adaptations and modifications of the embodiments described above can be configured without departing from the scope and spirit of the disclosure Therefore, it is to be understood that, within the scope of the appended claims, the teachings set forth in the present disclosure may be practiced other than as specifically described herein.

What is claimed is:

1. A system for use with a set of electric machines, the system comprising:
   a diagnostic unit coupled to the set of electric machines and configured to retrieve from at least one of the electric machines or to instruct the at least one of the electric machines to send a set of sensor measurements to determine a state of the at least one of the electric machines, and including:
   a processor; and
   a memory stored thereon a set of memory modules, which when executed by the processor, cause the processor to perform operations including:
      receiving the set of sensor measurements being operational data from at least two electric machines from the set of electric machines,
      generating, based on the operational data from each of the at least two electric machines, first sets of diagnostic data, by executing a first memory module being a non-adaptive module from the set of memory modules,
      generating, based on the operational data from each of the at least two electric machines, second sets of diagnostic data, by executing a second memory module being an adaptive module from the set of memory modules, the second memory module including an adaptive routine including a set of parameters associated with a diagnostics model for the set of electric machines, and
      effecting, based on the first sets of diagnostic data, the second sets of diagnostic data, and the operational data in parallel from one of the at least two electric machines, a change in at least one parameter from the set of parameters associated with the one of the at least two electric machines, wherein an existence of a fault is determined using both the first set of diagnostic data and the second set of diagnostic data.

2. The system of claim 1, wherein the set of sensor measurements include at least one of voltage, current, temperature, vibration, signature, and insulation integrity of the at least one of the electric machines.

3. The system of claim 1, wherein the effecting is further based on data received by the processor, the data being associated with an assessment from an operator.

4. The system of claim 1, wherein the second memory module is configured to cause the processor to perform an adaptive processing of the operational data.

5. The system of claim 1, wherein the first memory module is configured to cause the processor to perform a non-adaptive processing of the operational data.

* * * * *